United States Patent [19]

Takei

[11] 4,129,936
[45] Dec. 19, 1978

[54] METHOD FOR MANUFACTURING MONOLITHIC SEMICONDUCTOR MASK PROGRAMMABLE ROM'S

[76] Inventor: Sakae Takei, 1028 Kami Nakazato-cho, Isogo-ku, Yokohama-shi, Japan

[21] Appl. No.: 831,512

[22] Filed: Sep. 8, 1977

[30] Foreign Application Priority Data

Sep. 9, 1976 [JP] Japan .................................. 51-107238

[51] Int. Cl.$^2$ ............................................. B01J 17/00
[52] U.S. Cl. .................................... 29/571; 29/577 R; 29/578
[58] Field of Search .......................... 29/571, 577, 578; 357/91

[56] References Cited

U.S. PATENT DOCUMENTS

| | | | |
|---|---|---|---|
| 3,865,651 | 2/1975 | Arita | 29/571 |
| 3,996,657 | 12/1976 | Simko | 357/59 |
| 4,050,965 | 9/1977 | Ipri | 29/571 |

Primary Examiner—W. Tupman

[57] ABSTRACT

A method for manufacturing ROM's composed of a plurality of matrix-arranged IGFET's comprises a process for manufacturing a semiconductor device with no information yet written therein and a process for completing the ROM by writing predetermined information or memory in the no-information semiconductor device according to orders from users. The no-information semiconductor device may be produced by first forming a plurality of relatively thick rectangular oxide layers with a predetermined length, for separating the IGFET's, in parallel with one another on a substrate, then covering the whole surface of the substrate with a gate oxide layer and forming on such gate oxide layer a plurality of selective lines composed of polycrystalline silicon extending in parallel with one another across the separating oxide layers, removing the gate oxide film in regions surrounded by the selective lines and the separating oxide layers, and finally diffusing an impurity in the substrate by the thermal diffusion method to form a plurality of strip-shaped source regions and square drain regions. In storing memory in such no-information semiconductor device to complete the ROM, the whole surface of the semiconductor device, except specified gate regions between the source and drain regions corresponding to specified IGFET's, is covered with a photo-resist film, and the substrate is implanted with an impurity with the same type of conductivity as that of such substrate through the gate and gate oxide layer by the ion implantation method. Thereafter, the photo-resist film is removed, an oxide layer is grown over the surface by the low-temperature growth method, contact holes are bored through the oxide layer on the drain regions, and data lines composed of a plurality of parallel aluminum films substantially at regular intervals are formed on such oxide layer, the data lines passing over the contact holes across the selective lines. Portions of the substrate under the gates of specified IGFET's have a higher impurity concentration as compared with portions under the gates of other IGFET's, and the threshold voltage at the gates of such specified IFGET's is higher than that of other IGFET's.

8 Claims, 17 Drawing Figures

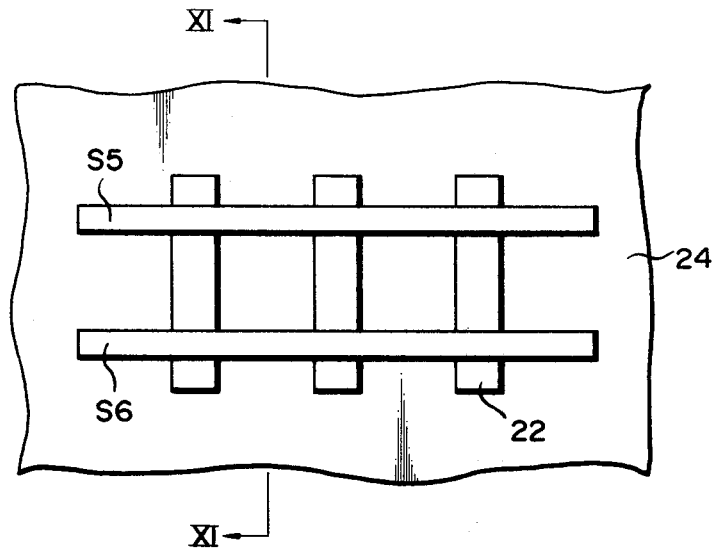
F I G. 10
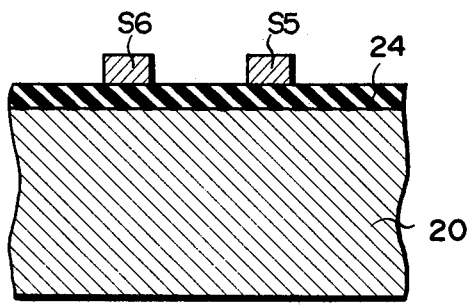
F I G. 11
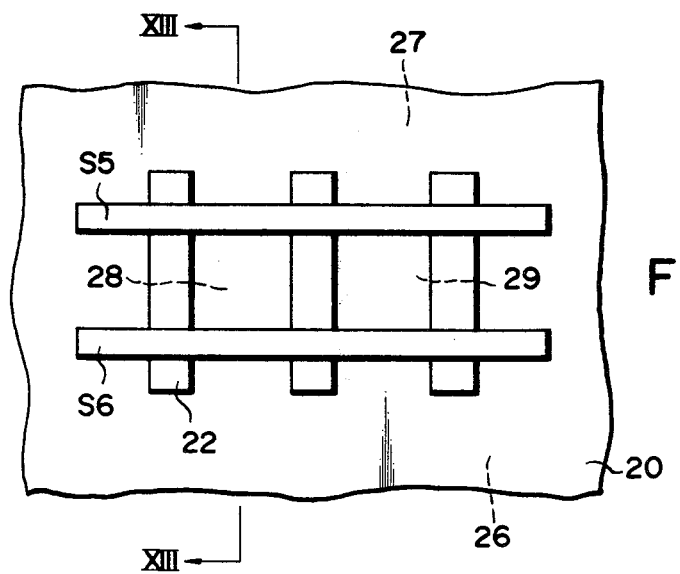
F I G. 12

METHOD FOR MANUFACTURING MONOLITHIC SEMICONDUCTOR MASK PROGRAMMABLE ROM'S

BACKGROUND OF THE INVENTION

This invention relates to an improved method for manufacturing a semiconductor mask programmable ROM (read only memory) including a plurality of matrix-arranged insulated gate enhancement type field effect transistors (hereinafter referred to simply as IGFET's).

The ROM including a plurality of semiconductor elements, expecially matrix-arranged IGFET's, is already known through varieties of literature and their improvement appears in the U.S. application Ser. No. 616,626 filed by the same assignee with this application.

The ROM is usually composed of a plurality of matrix-arranged IGFET's $T_{ij}$ (i = 1, 2, ... m; j = 1, 2, ..., n) as shown in FIG. 1. In reading out information stored in memory cells from such ROM, the ROM is so operated that one of selective lines $S_1$ to $S_M$ is given a selecting signal and the information in the memory cells appears at the output of data lines D1 to DN. The memory cells correspond to their respective IGFET's $T_{ij}$, and the information in each memory cell is determined by whether its corresponding IGFET is allowed to conduct by the selective signal or not. Therefore, in order to complete the ROM by writing information in the semiconductor device, the IGFET's should be so constructed that only a predetermined IGFET among a number of IGFET's $T_{ij}$ in the semiconductor device can operate, remaining IGFET's being prevented from operation. There are generally two types of well-known devices as completed ROM's including IGFET's to operate as memory cell, which are produced in different ways.

(First Device)

A first device is an ROM includng a number of IGFET's $T_{ij}$ and Tk2 ( $k \neq i$ or $l \neq j$) in which the drains of prescribed IGFET's $T_{ij}$ are opened to prevent such IGFET's $T_{ij}$ from operating and the drains of other IGFET's $T_{kl}$ are connected to a data line D1. For example, as shown in FIGS. 2 and 3, drains 2-66 and 2-77 formed on a substrate 1 correspondingly to IGFET's T66 and T77 are connected to prescribed data lines D6 and D7, while drains 2-67 and 2-76 formed on a substrate 1 correspondngly to other IGFET's T67 and T76 are not connected to the prescribed data lines D6 and D7 but opened. That is, while contact holes 6 and 8 are bored through a thin oxide layer 4 disposed over the drains 2-66 and 2-77 of the IGFET's T66 and T77, there is bored no such contact holes through the thin oxide layer 4 on the drains 2-67 and 2-76 of the IGFET's T67 and T76. In the ROM as shown in FIGS. 2 and 3, when a selecting signal is applied to a selective line S6 made of e.g. polycrystalline silicon, a source 10-6 and a drain 2-66 of the IGFET T66 communicate with each other because such selective line S6 also functions as the gate of the IGFET T66, thereby allowing the data line D6 to be supplied with an earth potential. As for the IGFET T67, it has the selective line S6 as its gate for common use with the IGFET T66, though its drain 2-67 is not connected and hence cannot communicate with the data line D7. Consequently, the data line D7 is not supplied with the earth potential from the source 10-6 of the IGFET T67 but is supplied with a line voltage $V_{DD}$.

In FIG. 3, numeral 11 denotes a thick oxide layer for separating the IGFET's $T_{k1}$ from one another. The IGFET's T66 and T67 include the source 10-6 in common, while the IGFET's T76 and T77 include the source 10-7 in common.

In the ROM of a type as shown in FIGS. 2 and 3, information is written in a relatively late step of the manufacturing steps. That is, information writing may be executed by boring contact holes through the thin oxide layer 4 on the drain 2, while the step of boring such contact holes corresponds to a relatively late step of the manufacturing processes. Therefore, manufacturers previously advance the manufacture of the semiconductor devices so far as the last step before boring the contact holes, and thereafter bore such contact holes in accordance with orders from users, thereby allowing ROM's to be manufactured in compliance with user's requests in a short period of time. The ROM as shown in FIGS. 2 and 3 is advantageous because of its shorter period of time from ordering to delivery.

(Second Device)

A second device is an ROM in which the gate oxide layer under the gates of the prescribed IGFET's Tij, i.e., selective lines $S_i$ is made thicker to increase the threshold voltage of such gates, while the gate oxide layer under the gates of other IGFET's $T_{1k}$ (1 $\neq$ i or k $\neq$ j) is made thinner to reduce the threshold voltage of such gates below the aforesaid voltage, thus allowing the IGFET's $T_{1k}$ alone to operate when a prescribed level of input is applied to the selective lines S. For example, as shown in FIGS. 4 and 5, the gate of the IGFET T76, i.e., a selective line S7 is embedded in the thick oxide layer 11 for separating the transistors from one another, and the thickness of the gate oxide layer from the gate S7 of the IGFET T76 to the substrate 1 is large. On the other hand, the gate of the IGFET T66, i.e., the selective line S6 is embedded in the thin oxide layer 4, and the thickness of such oxide film from the gate S6 of the IGFET T66 to the substrate 1 is smaller than that of the oxide layer under the gate S7 of the IGFET T76. Accordingly, the gate threshold voltage of the IGFET T76 is higher than that of the IGFET T66, and the IGFET T76 will not operate if the gate S7 of the IGFET T76 is supplied with a voltage high enough to operate the IGFET T66. In the ROM as shown in FIGS. 4 and 5, when an input signal large enough to operate one IFGET is applied to the selective line made of e.g. polycrystalline silicon, the IGFET T66 is caused to conduct because such selective line S6 also functions as the gate of the IGFET T66, thereby allowing the data line D6 to be supplied with an earth potential. As for the IGFET T67, it has the selective line S6 as its gate for common use with the IGFET T66, though its threshold voltage is too high to conduct by the input applied to the selective line S6. Consequently, the data line D7 is not supplied with the earth potential but is supplied with a line voltage $V_{DD}$.

In the ROM of a type as shown in FIGS. 4 and 5, information is written in a relatively early step of the manufacturing steps. That is, determination of the thickness of the gate oxide layer equivalent to a process for writing information is executed in the step of patterning the separating oxide layer, a relatively early step of the manufacturing steps. Therefore, this type of ROM is subject to a defect that the period of time from user's ordering to delivery is longer as compared with the first device. As may be clear from FIGS. 4 and 5, however, two IGFET's, e.g., T66 and T76 or T67 and T77 have a single drain, e.g., 2-66, 76 or 2-67, 77 as well as a contact hole 14 or 16 over such drain for common use. Accordingly, the second type of ROM as shown in FIGS. 4 and 5 is higher in degree of integration as compared with the first type of ROM as shown in FIGS. 2 and 3, reducing the cell area for the same information to approximately 60% of that of the first type. As a result, the second device is advantageous because of its possibility of requiring lower cost.

Basically, there have conventionally been known these two types of devices, while at present are expected the advent and development of ROM's combining the advantages of both types.

SUMMARY OF THE INVENTION

An object of this invention is to provide a method for manufacturing a semiconductor mask programmable ROM capable of allowing a great deal of information to be written in narrow cells as well as of shortening the period of time from ordering to delivery of ROM's with prescribed information, ordered by users, written therein.

According to this invention, there is provided a method for manufacturing a monolithic semiconductor mask programmable ROM composed of a plurality of matrix-arranged IGFET's comprising:

(a) a process for manufacturing a semiconductor device with no information yet written therein, including steps of
  (i) a forming a plurality of relatively thick rectangular oxide layers for separating said IGFET's from one another at intervals over a substrate,
  (ii) a forming a relatively thin gate oxide layer all over said substrate and further forming a number of selective lines to be supplied with input signals, said selective lines being arranged across said relatively thick separating oxide layers at intervals over said gate oxide layer, and
  (iii) a forming a number of source and drain regions by removing said relatively thin gate oxide layer in regions surrounded by said selective lines and said relatively thick separating oxide films and diffusing an impurity with conductivity opposite to that of said substrate; and (b) a process for completing said ROM by writing information in said semiconductor device, including steps of
  (iv) an applying an impurity with the same type of conductivity to portions of said substrate under gate regions between the source regions and their corresponding drain regions forming specified IGFET's selected from a number of IGFET's to form said semiconductor device according to an order from user through the gate oxide layer and the selective lines over said portions of the substrate, thereby changing the impurity concentration of said portions of the substrate with respect to that inherent in said substrate, and
  (v) a covering the whole surface of said semiconductor device with an oxide layer, boring contact holes through said oxide layer over said drain regions, and forming a number of data lines to produce a plurality of data, said data lines passing over said contact holes at intervals across said selective lines and connected to said drains through said contact holes.

BRIEF DESCRIPTION OF THE DRAWING

FIGS. 8 to 15 show successively processes of an embodiment of the method for manufacturing the monolithic semiconductor mask programmable ROM of this invention, wherein:

FIGS. 8, 10, 12 and 14 are schematic plan views of the semiconductor devices manufactured in the respective steps, and FIGS. 9, 11, 13 and 15 are sectional views as taken along lines IX—IX of FIGS. 8, XI—XI of FIG. 10, XIII—XIII of FIG. 12 and XV—XV of FIG. 14, respectively.

DETAILED DESCRIPTION OF THE PREFERRED EMBODIMENT

Now I will describe in detail the method of manufacturing monolithic semiconductor mask programmable ROM's according to an embodiment of this invention with reference to the accompanying drawings.

Figure 1:
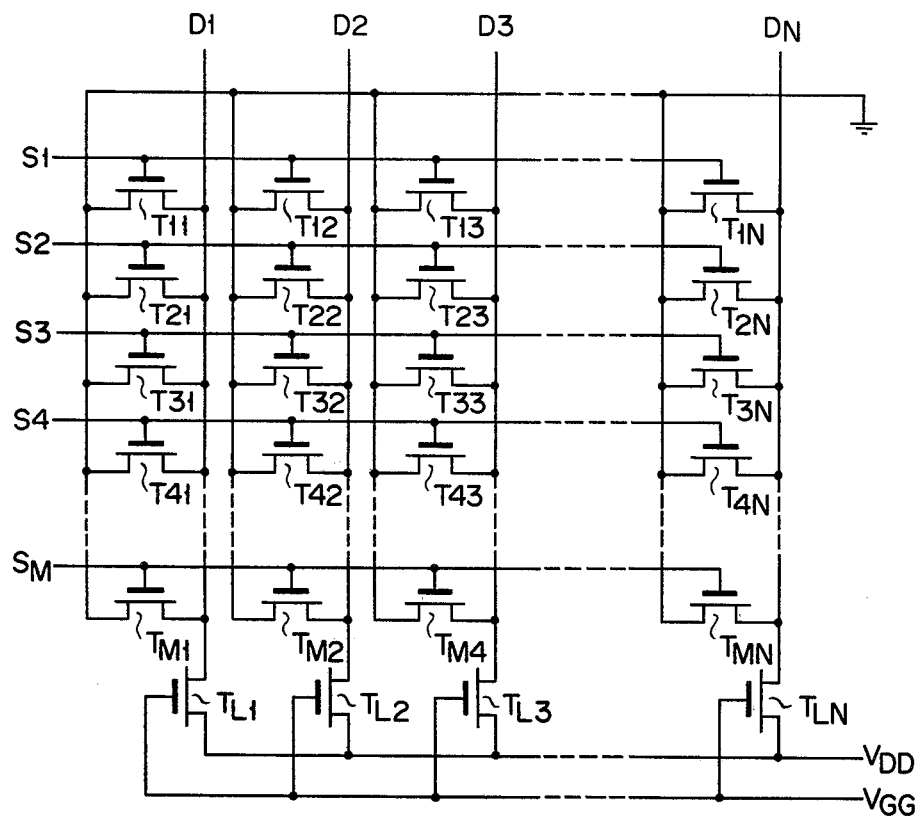
FIG. 1 shows a general equivalent circuit of the monolithic semiconductor mask programmable ROM composed of a plurality of general matrix-arranged IGFET's.
Figure 2:
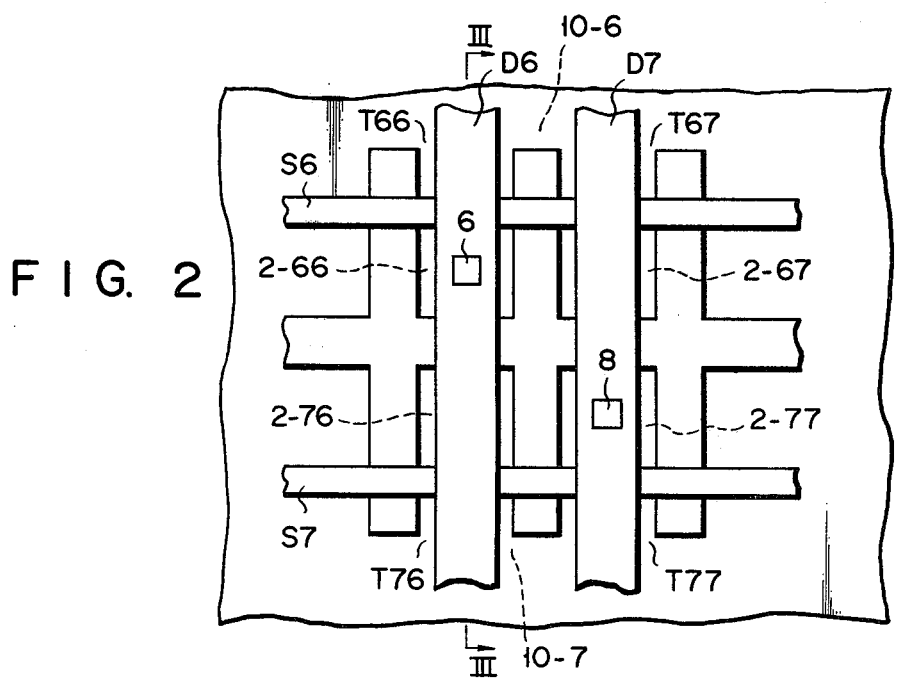
FIGS. 2 and 4 are schematic plan view of conventional monolithic semiconductor mask programmable ROM's.
Figure 3:
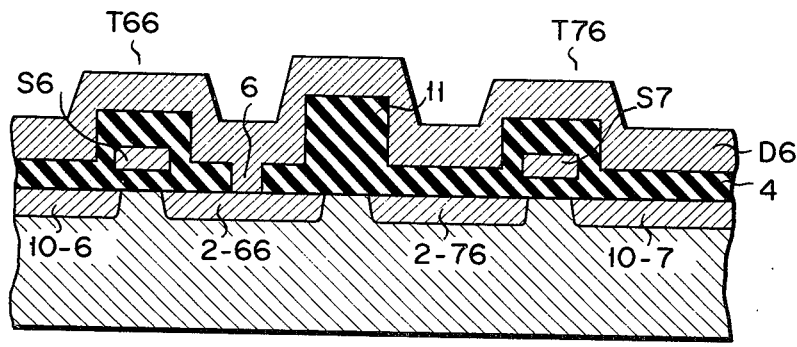
FIGS. 3 and 5 are sectional views as taken along lines III—III of FIG. 2 and V—V of FIG. 4, respectively.
Figure 4:
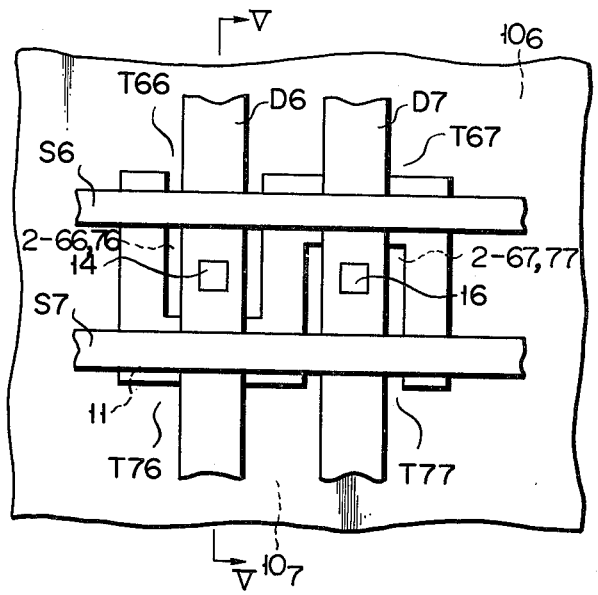
Figure 5:
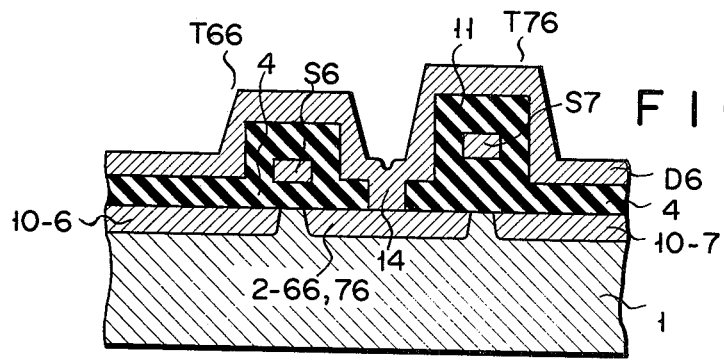
Figure 6:
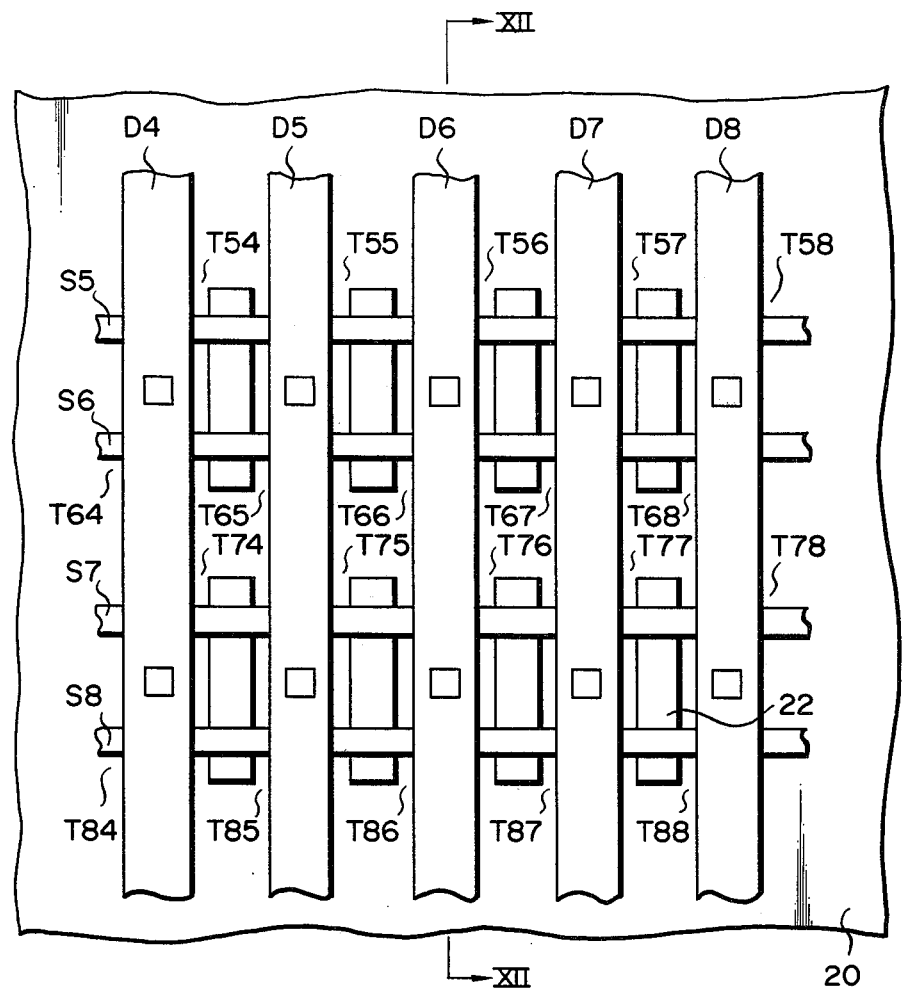
FIG. 6 is a schematic plan view of the monolithic semiconductor mask programmable ROM of this invention.
Figure 7:
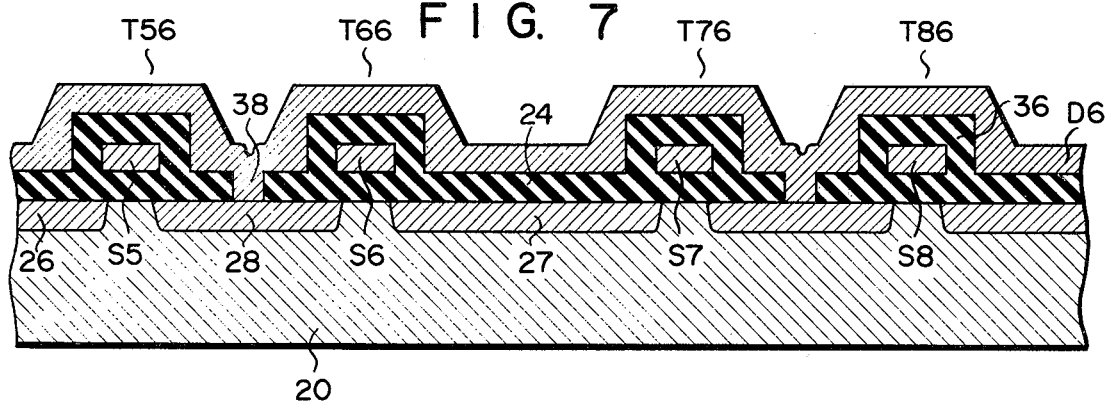
FIG. 7 is a sectional view as taken along line VII—VII of FIG. 6.
Figure 8:
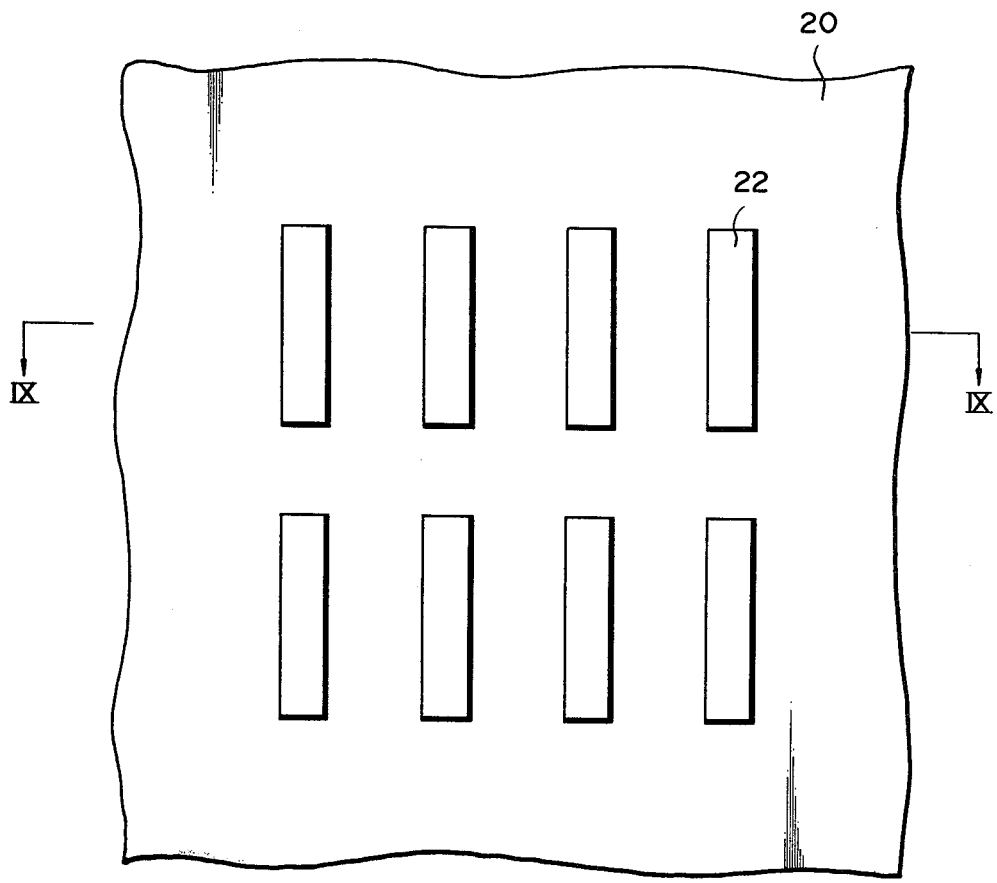

FIGS. 6 and 7 are schematic pattern plan view and a sectional view as taken along line XII—XII of FIG. 6, respectively, of a part of the monolithic semiconductor mask programmable ROM manufactured by the method of this invention, with information already written therein. In FIG. 6, there are shown by way of example 16 IGFET's formed adjacent to one another among a plurality of matrix-arranged IGFET's $T_{ij}$. Meanwhile, FIG. 7 shows four IGFET's by way of example. For convenience, there will be expressly described four IGFET's T55, T56, T65 and T66. Though information may be written optionally and diversely in the semiconductor device as shown in FIGS. 6 and 8, it is assumed that the IGFET's T55, T56, T65 and T66 are so constructed that if an input is applied to a selective line S5, for convenience, the IGFET T55 will operate and the IGFET T56 will not. On the other hand, if an input is applied to a selctive line S6, then the IGFET T65 will not operate, while the IGFET T66 will. Therefore, when the input is applied to the selective line S5, an earth potential is supplied from a data line D5, while a voltage $V_{DD}$ is supplied from a data line D6. Likewise, when the input is applied to the selective line S6, the voltage $V_{DD}$ is supplied from the data line D5, while the earth potential is supplied from the data line D6.

Now I will describe the method for manufacturing the ROM supposed to have the four IGFET's T55, T56, T65 and T66 so constructed as described above and prescribed information written therein. Though the construction of the four IGFET's T55, T56, T65 and T66 varies with information to be written, it is clear from the undermentioned description that each IGFET may be constructed optionally.

Figure 9:
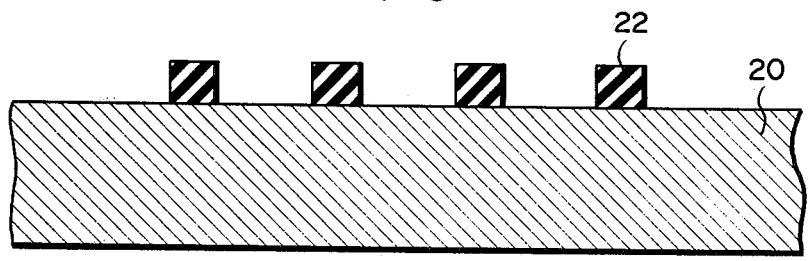

First, as shown in FIGS. 8 and 9, a plurality of relatively thick rectangular oxide layers 22 for separation are formed in parallel with one another susbstantially at regular intervals on a substrate 20. These separating oxide layers 22 are formed by growing e.g. and approximately 1 $\mu$ thick silicon oxide layer all over the p-type silicon substrate 20 with the specific resistance of e.g. approximately 10 $\Omega$cm and then selectively removing such oxide layer by the well-known photo-etching Subsequently, gate electrodes or selective lines $S_k$ are formed. That is, a gate oxide layer 24 is grown all over the substrate 20 with the separating oxide layer 22 formed thereon, and, as shown in FIGS. 10 and 11, on such oxide layer 24 are formed a plurality of stripe-shaped selective lines $S_k$ (S5 and S6 in FIG. 10) composed of polycrystalline silicon to function as gate electrodes for IGFET's $T_{k1}$ arranged substantially in parallel with one antoehr at regular intervals. The gate oxide layer 24 is as thick as a relatively thin, e.g., 0.1 $\mu$m thick SiO$_2$ film. Meanwhile, the selective lines $S_k$ are formed by growing e.g. 0.3 $\mu$m thick polycrystalline silicon over the top surface of the gate oxide layer 24 and then selectively removing a polycrystalline silicon layer by the photo-etching method so that portions of such layer remain in the form of strip-shaped layers substantially perpendicular to the rectangular separating oxide layers 22.

Figure 13:
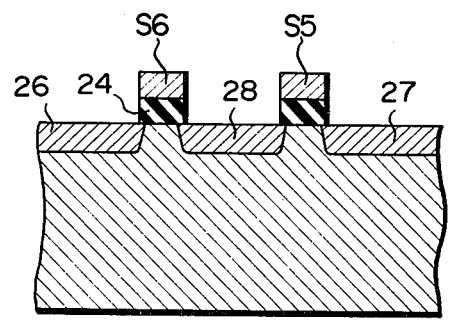

Further, a source region 26 and a drain region 28 are formed. That is, as shown in FIGS. 12 and 13, the relatively thin oxide layer 24 in square regions surrounded by the strip-shaped selective lines S5 and S6 and the separating oxide films 22 as well as in regions surrounded by these selective liens S5 and S6 and other selective lines S7 and S8 is removed, and source regions 26 and 27 and drain regions 28 and 29 are formed by diffusing an n-type impurity with the type of conductivity opposite to that of the substrate 20, such as phosphorus, over the substrate 20 cleared of the oxide layer 24. The drain region 28 is common to the IGFET's T55 and T65, while the drain region 29 is common to the IGFET's T56 and T66.

Meanwhile, the source regions 26 and 27 extend over the substrate in parallel with the selective lines S5 and S6 respectively. The source region 26 is common to the IGFET's T55 and T56 as well as to the IGFET's T45 and T46 (not shown). Likewise, the source region 27 is common to the IGFET's T65 and T66 as well as to the IGFET's T75 and T76 (FIG. 6).

Usually, manufactures would forward the manufacture of ROM's up to the stage of the above-mentioned step only producing semiconductor devices with no information yet written therein. Thereafter, when an order for an ROM with predetermined information written therein is given by a user, then a subsequent process is started.

Figure 14:
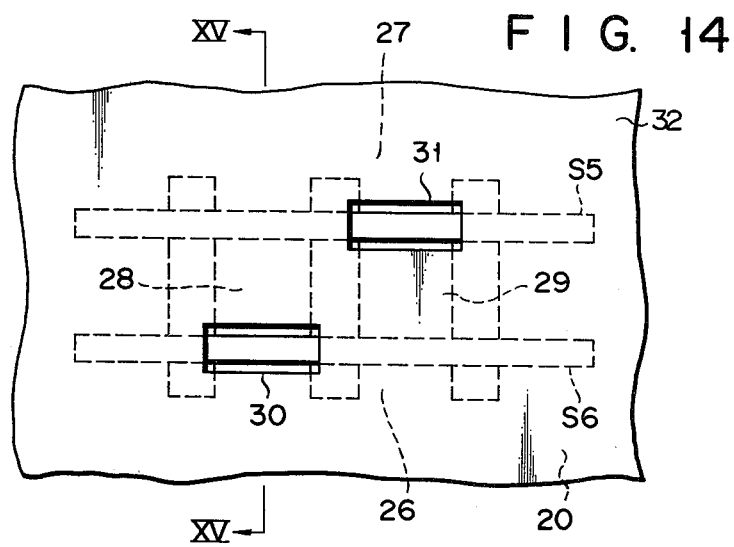
Figure 15:
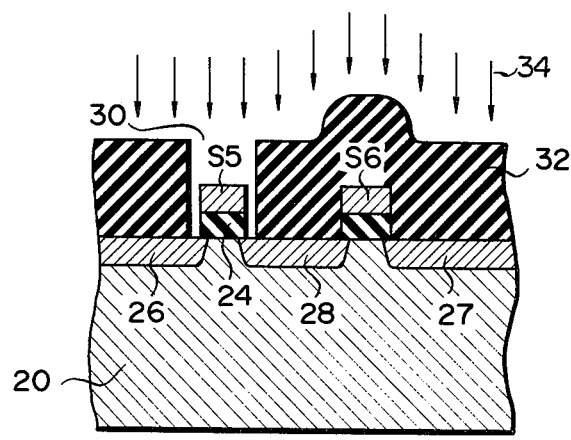

For the first time is started a process for writing information in the semiconductor device manufactured in the aforesaid steps. The writing of information is determined by whether the threshold voltage at the gate electrodes of optional IGFET's $T_{k1}$ is increased or kept as it is. Namely, as shown in FIGS. 14 and 15, all the regions are covered with a photo-resist film 32, excepting gate regions 30 and 31 of the specified IGFET's T56 and T65 requiring their threshold voltage to be increased. The gate region 30 includes a part of the selective lines $S_k$ functioning as the gates of the IGFET's $T_{k1}$, as already mentioned above, and also the peripheral regions of such part. This also applies to the gate region 31. Meanwhile, the semiconductor device with the photo-resist film 32 formed thereon is implanted with a p-type impurity 34 with the same type of conductivity as that of the substrate 20, such as boron, by the ion implantation method. Since all the regions other than the specified gate regions 30 and 31 are covered with the photo-resist film 32, ion implantation may enhance the p-type impurity concentration of the portions of the substrate 20 in such gate regions 30 and 31. Consequently, the threshold voltage at the gate of the IGFET T56 and T65, having the selective line S5 or S6 in the gate region 30 or 31 as its gate, is increased above the threshold voltage at the gates of the remaining IGFET's T55 and T66.

The ion acceleration voltage in the ion implantation method is so selected that ions may not reach the substrate 20 through the photo-resist film 32, while the ions implanted in the gate regions 30 and 31 are required to reach the substrate through the selective lines S6 and S7 in these regions and the gate oxide layer 24 under such selective lines S6 and S7. Further, the quantity of ions implanted in the portions of the substrate 20 in the gate regions 30 and 31 should be so determined that the gate threshold voltage of the IGFET's T67 and T76 in the gate regions 30 and 31 may be higher than a signal voltage to be applied to the selective lines S5 and S6. Also, the withstanding inverse voltage at the p-n junctions between the ion-implanted substrate 20 with enhanced impurity concentration and the respective pairs of the source regions 26 and 27 and the drain regions 28 and 29 of the IGFET's T56 and T65 should not drop below the signal voltage to be applied to the selective lines S5 and S6. Thus, the ion acceleration voltage and implanted ion quantity are so determined as to meet the above requirements, and besides the thickness of the photo-resist film 32 may be determined properly in accordance with such requirements.

According to an experiment made by the inventor hereof, the threshold voltage at the gate in the region to be implanted with ions and the withstanding inverse voltage at the p-n junction between the source or drain of the IGFET in such region and the substrate could be determined at nearly 7V and 10V respectively by setting the ion acceleration voltage and implanted ion quantity at 120kV and 5 $\times$ 10$^{12}$ cm$^{-2}$ respectively. With these values, a completed ROM will operate properly provided the input signal for the selective line S1 is at 5V. If the input signal is at 5V, then the completed ROM may be deemed to be a fully practical circuit.

After completion of writing of information in the semiconductor device, the data lines D6 and D7 are formed and the ROM is completed. When implantation of ions in the semiconductor device as shown in FIG. 15 is finished, the photoresist film 32 is removed. Thereafter, an insulating oxide layer 36 is formed over the whole surface of the semiconductor device by the low-temperature growth method. Portions of the oxide layer 36 on the drains 28 and 29 are removed and a contact hole is bored at each of such portions. A pluraity of stripe-shaped aluminum films are evaporated on to the oxide layer 36 so as to pass over the contact holes 38 across the selective lines S5 and S6, thus forming the data lines D5 and D6 connected to the drain 28 and 29.

According to the method for manufacturing the ROM of this invention as described above, information may be written in an earlier process as compared with the manufacturing method for the first conventional semiconductor device, though such process is later as compared with the manufacturing method for the second conventional semiconductor device. Therefore, according to the manufacturing method of the invention, the period of time from user's ordering to delivery of ROM may be reduced fully shorter as compared with the manufacturing method for the first conventional semiconductor device. In addition, in the ROM produced by the method of the invention, two IGFET's share one drain like the case of the second conventional semiconductor device. Accordingly, the ROM of the invention is higher in degree of integration and lower in price as compared with the first conventional device.

Now I will describe a modified embodiment of this invention. Though in the aforesaid embodiment information is written after the formation of the source regions 26 and 27 and the drain regions 28 and 29, in this modified embodiment of the invention information is written prior to the formation of the data lines D5 and D6. That is, in the method for manufacturing the ROM of this invention according to this modified embodiment, the same steps are used so far as the formation of the source regions 26 and 27 and drain regions 28 and 29 as shown in FIGS. 12 and 13, though the subsequent processes are subject to the following procedure.

Figure 16:
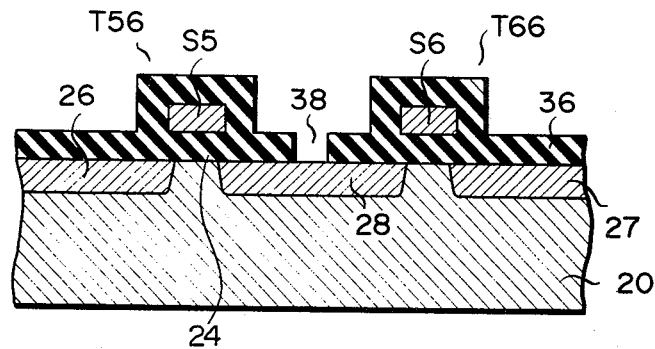
FIGS. 16 and 17 are schematic sectional views illustrating the information writing process of the method for manufacturing the monolithic semiconductor mask programmable ROM according to an alternative embodiment of this invention.

An insulating oxide layer 36 is formed by the low-temperature growth method over the whole surface of the semiconductor device with the source regions 26 and 27 and drain region 28 formed thereon. Thereafter, as shown in FIG. 16, portions of the oxide film 36 over the drains 28 and 29 are removed and a contact hole 38 is bored at each of such portion.

In this modified embodiment of the invention, the manufacturing step is advanced to the above stage, where there is provided the semiconductor device with no information yet written therein. Thereafter, when an order is given by a user, there will be started the subsequent steps including the step of writing information.

Figure 17:
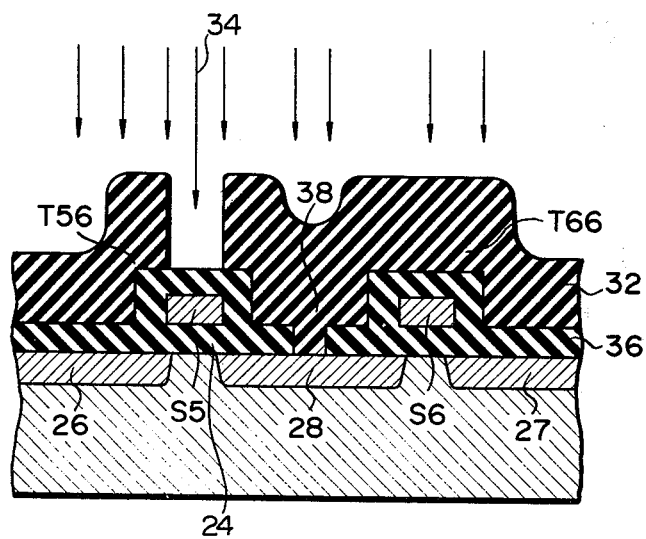

As shown in FIG. 17, the oxide layer 36 of the semiconductor device is covered with the photo-resist film 32, excepting the regions over the gate regions 30 and 31 of the specified IGFET's T56 and T65 requiring higher threshold voltage. Such semiconductor device, with the photo-resist film 32 formed thereon, is implanted with a p-type impurity 34 by the ion implantation method. Since the specified gate regions 30 and 31 are not covered with the photo-resist film 32, the implanted impurity may reach the substrate 20 through the oxide layer 36, the selective lines S5 and S6 composed of polycrystalline silicon, and the gate oxide layer 24. As a result, the portions of the substrate 20 in the gate regions are increased in p-type impurity concentration.

Thereafter, the photo-resist film 32 is removed, and the stirp-shaped data lines D5 and D6 composed of thin aliminum films are formed on the oxide film 36 shown in FIGS. 7 and 6.

According to this modified embodiemnt, information is written in a later step as compared with the first embodiment of the invention as mentioned previously, so that the period from ordering to delivery of products may be shortened.

The method for manufacturing the ROM of the invention is not limited to the above embodiments but may be variously changed and modified as follows.

Although in the above embodiments the IGFET's used for forming the ROM are N-channel silicon gate transistors, p-channel silicon gate transistors may also be used. If the p-channel silicon gate transistors are used, then the impurity to be implanted by the ion implantation method may be an n-type impurity such as phosphorus. It is to be understood that this invention also applies to ROM's with complementary circuit construction.

Further, although the ROM is composed of a silicon gate MOS integrated circuit in the above embodiments, a metallic gate MOS integrated circuit may also be used. In this case, the gate electrodes, i.e., the selective lines S5 and S6 may be formed from aluminum, molybdenum, tungsten or the like metal, while the ROM is produced in the same manufacturing steps.

Moreover, though in the above embodiments the impurity concentration of the portions of the substrate 20 in the specified gate regions 30 and 31 is enhanced by the ion implantation method, it may also be enhanced by the thermal diffusion method. That is, in the information writing process as shown in FIG. 15, the photo-resist film 32 is replaced by a silicon nitride film, and, with such silicon nitride film used as a mask, gallium or the like exhibiting a relatively high diffusion speed in silicon and silicon oxide layer is diffused selectively by thermal diffusion, thereby enhancing the impurity concentration of the portions of the substrate 20 in the gate regions covered with no nitride film.

Thus, according to the method for manufacturing the ROM of this invention, there may be achieved reduction of the period of time from user's ordering to delivery of ROM as well as compactification of the completed ROM.

What is claimed is:

1. A method for manufacturing a monolithic semiconductor mask programmable ROM composed of a plurality of matrix-arranged IGFET's, comprising:
   (a) a process for manufacturing a semiconductor device with no information yet written therein, including steps of
      (i) forming a plurality of relatively thick rectangular oxide layers for separating said IGFET's from one another at intervals on a substrate,
      (ii) forming a relatively thin gate oxide layer all over said substrate and further forming a number of selective lines to be supplied with input signals, said selective lines being arranged across said relatively thick separating oxide layers at intervals on said gate oxide layer, and
      (iii) forming a number of source and drain regions by removing said relatively thin gate oxide film in regions surrounded by said selective lines and said relatively thick separating oxide layers and diffusing an impurity with conductivity opposite to that of said substrate; and
   (b) a process for completing said ROM by writing information in said semiconductor device, including steps of
      (iv) applying an impurity to portions of said substrate under gate regions between the source regions and their corresponding drain regions forming specified IGFET's selected from a number of IGFET's to form said semiconductor device according to an order from user through the gate oxide layer and the selective lines on said portions of the substrate, thereby changing the impurity concentration of said portions of the substrate with respect to that inherent in said substrate, and (v) covering the whole surface of said semiconductor device with an oxide layer, boring contact holes through said oxide layer on said drain regions, and forming a number of data lines to produce a plurality of data, said data lines passing over said contact holes at intervals across said selective lines and connected to said drain regions through said contact holes.

2. A method for manufacturing a monolithic semiconductor mask programmable ROM according to claim 1, wherein the impurity used in the impurity applying steps has the same conductivity type as that of the substrate.

3. A method for manufacturing a monolithic semiconductor mask programmable ROM according to claim 1, wherein said steps of applying the impurity and changing the impurity concentration of said portions of the substrate under said gate regions forming said specified IGFET's according to the order from user includes covering the surface of said semiconductor device except said specified gate regions with a photo-resist film and then implanting the substrate with an impurity with the same type of conductivity as that of said substrate through the selective lines and gate oxide layer in said specified gate regions by the ion implantation method.

4. A method for manufacturing a monolithic semiconductor mask programmable ROM according to claim 1, wherein said steps of applying the impurity and changing the impurity concentration of said portions of the substrate under said gate regions forming said specified IGFET's according to the order from user includes covering the surface of said semiconductor device except said specified gate regions with a silicon nitride film and then diffusing an impurity through the selective lines and gate oxide layer in said specified gate regions by the thermal diffusion method.

5. A method for manufacturing a monolithic semiconductor mask programmable ROM composed of a plurality of matrix-arranged IGFET's, comprising:

(a) a process for manufacturing a semiconductor device with no information yet written therein, including steps of (i) forming a plurality of relatively thick rectangular oxide layer for separating said IGFET's from one another at intervals on a substrate, (ii) forming a relatively thin gate oxide layer all over said substrate and further forming a number of selective lines to be supplied with input signals, said selective lines being arranged across said relatively thick separating oxide layer at intervals on said gate oxide layer, (iii) forming a number of source and drain regions by removing said relatively thin gate oxide layer in regions surrounded by said selective lines and said relatively thick separating oxide layer and diffusing an impurity with conductivity opposite to that of said substrate, and (iv) covering the surface of said substrate, with said source and drain regions formed thereon, with an oxide layer and boring contact holes through said oxide layer; and (b) a process for completing said ROM by writing information in said semiconductor device, including steps of (v) applying an impurity to portions of said substrate under gate regions between the source regions and their corresponding drain regions forming specified IGFET's selected from a number of IGFET's to form said semiconductor device according to an order from user through the gate oxide layer, the selective lines, and the oxide layer formed in the preceding step over said portions of the substrate, thereby changing the impurity concentration of said portions of the substrate with respect to that inherent in said substrate, and (vi) process for forming a number of data lines to produce a plurality of data, said data lines passing over said contact holes at intervals across said selective lines and connceted to said drains through said contact holes.

6. A method for manufacturing a monolithic semiconductor mask programmable ROM according to claim 5, wherein the impurity used in the impurity applying steps has the same conductivity type as that of the substrate.

7. A method for manufacturing a monolithic semiconductor mask programmable ROM according to claim 5, wherein said steps of applying the impurity and changing the impurity concentration of said portions of the substrate under said gate regions forming said specified IGFET's according to the order from user includes covering the surface of said semiconductor device except said specified gate regions with a photo-resist film and then implanting the substrate with an impurity with the same type of conductivity as that of said substrate through the selective lines and gate oxide layer in said specified gate regions by the ion implantation method.

8. A method for manufacturing a monolithic semiconductor mask programmable ROM according to claim 5, wherein said steps of applying the impurity and changing the impurity concentration of said portions of the substrate under said gate regions forming said specified IGFET's according to the order from user includes covering the surface of said semiconductor device except said specified gate regions with a silicon nitride film and then diffusing an impurity through the selective lines and gate oxide layer in said specified gate regions by the thermal diffusion method.

* * * * *

UNITED STATES PATENT AND TRADEMARK OFFICE
CERTIFICATE OF CORRECTION

PATENT NO. : 4,129,936
DATED : December 19, 1978
INVENTOR(S) : SAKAE TAKEI

It is certified that error appears in the above-identified patent and that said Letters Patent are hereby corrected as shown below:

First page, after inventor's name, assignee has been left off. Please add:

Assignee: Tokyo Shibaura Electric Co., Ltd.
              Tokyo, Japan

Signed and Sealed this

*Twelfth* Day of *February 1980*

[SEAL]

*Attest:*

SIDNEY A. DIAMOND

*Attesting Officer*     *Commissioner of Patents and Trademarks*